United States Patent [19]
Oertle et al.

[11] Patent Number: 5,296,760
[45] Date of Patent: Mar. 22, 1994

[54] VOLTAGE TRANSLATOR

[75] Inventors: Kent C. Oertle, Phoenix, Ariz.; Jia S. Chiang, Taipei, Taiwan

[73] Assignee: Motorola, Inc., Schaumburg, Ill.

[21] Appl. No.: 914,731

[22] Filed: Jul. 20, 1992

[51] Int. Cl.$^5$ ........................................ H03K 19/092
[52] U.S. Cl. .................................. 307/475; 307/443; 307/456; 307/300
[58] Field of Search ............... 307/443, 455, 456, 475, 307/246, 300, 299.2

[56] References Cited

U.S. PATENT DOCUMENTS

| | | | |
|---|---|---|---|
| 4,368,395 | 1/1983 | Taylor | 307/475 X |
| 4,514,651 | 4/1985 | Miller et al. | 307/475 |
| 4,623,803 | 11/1986 | Thompson et al. | 307/475 |
| 4,698,525 | 10/1987 | Tanana et al. | 307/456 |
| 4,931,673 | 6/1990 | Naghshinch | 307/443 X |
| 4,988,898 | 1/1991 | Jansson | 307/475 |
| 4,996,452 | 2/1991 | Yu et al. | 307/475 |
| 5,047,672 | 9/1991 | Bhuva et al. | 307/455 X |
| 5,153,456 | 10/1992 | Keown | 307/443 |
| 5,101,124 | 3/1992 | Estrada | 307/456 X |

FOREIGN PATENT DOCUMENTS 1318527  5/1973  United Kingdom ................ 307/456

*Primary Examiner*—David M. Hudspeth
*Attorney, Agent, or Firm*—Robert F. Hightower; Joe E. Barbee

[57] ABSTRACT

A differential ECL signal is converted to a first current and a second current that are proportional to the ECL signal. An upper output transistor (16) and a lower output transistor (57) are selectively enabled and disabled by the first current. The second current is used to enable discharging of a storage capacitance of the lower output transistor (57) thereby substantially disabling the lower output transistor (57) before the upper output transistor (16) is enabled. In addition, a capacitor is used to momentarily discharge the storage capacitance as the upper output transistor (16) is enabled. The capacitor is discharged when the upper output transistor (16) is disabled.

18 Claims, 1 Drawing Sheet

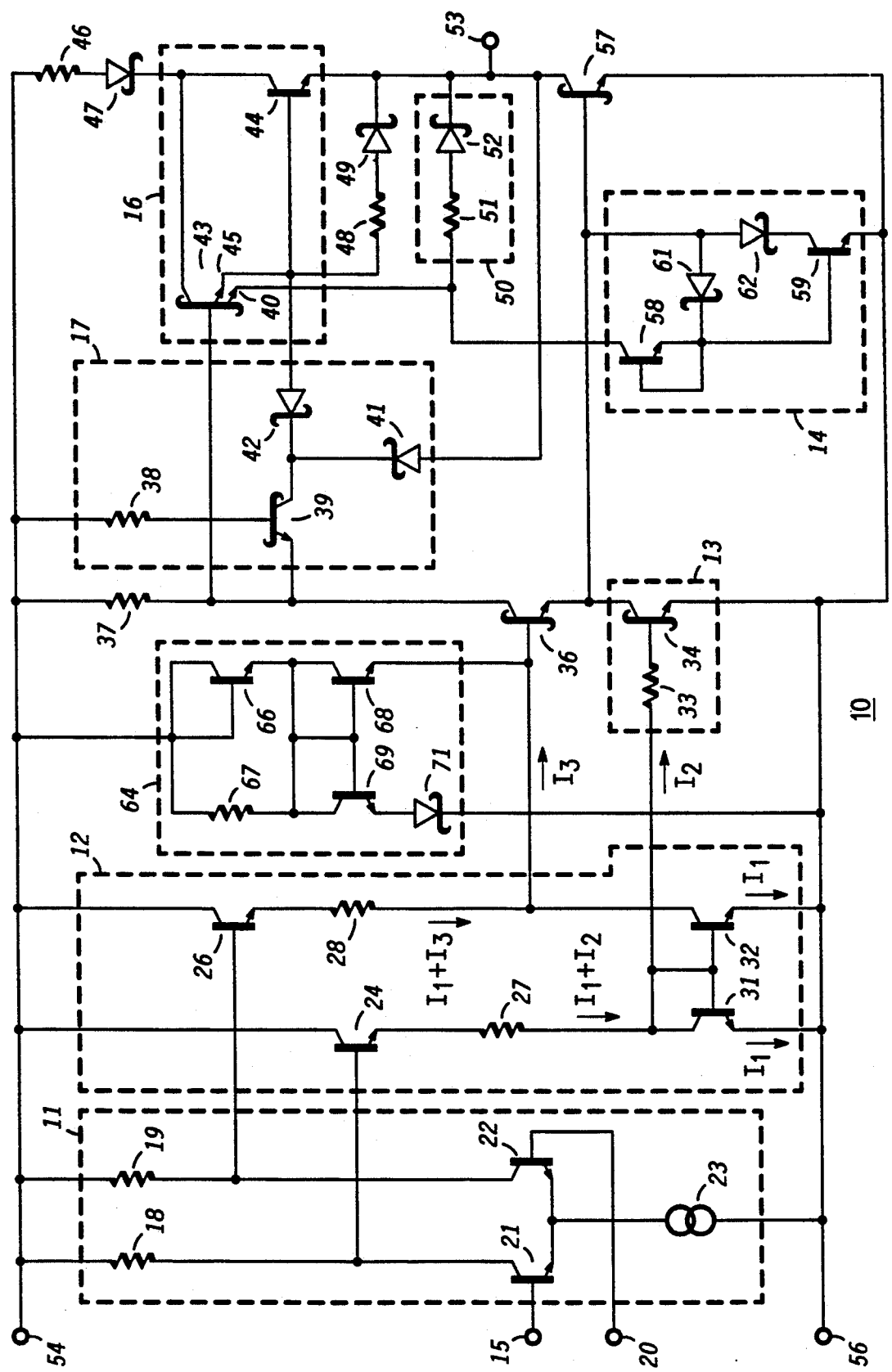

VOLTAGE TRANSLATOR

BACKGROUND OF THE INVENTION

The present invention relates, in general, to electrical circuits, and more particularly, to a novel voltage translator circuit.

In the past, voltage translator circuits have been utilized to translate the voltage level of emitter coupled logic (ECL) signals to voltage levels that are compatible with transistor-transistor logic (TTL), complementary metal oxide semiconductor (CMOS) logic, or other compatible signals. Prior translators typically employ an input stage that receives a differential ECL signal, and uses the input signal to control a pair of transistors connected in series between two power supply terminals. Such series connected transistors are commonly referred to as a totem-pole output stage. As the differential input signal changes state, the upper and lower transistors of the output stage are often simultaneously enabled thereby permitting large currents to flow through both output transistors. These large currents, commonly referred to as "through" current, increase power dissipation, induce noise into the power supply and can disturb the operation of adjacent circuits.

Accordingly, it is desirable to have a voltage translator circuit that does not simultaneously enable both output transistors, that substantially eliminates "through" current, and that does not induce noise into the power supply.

SUMMARY OF THE INVENTION

Briefly stated, the present invention includes converting a differential ECL signal to a first current and a second current that are proportional to the ECL signal. The first current is used to selectively enable and disable an upper output transistor and a lower output transistor between substantially mutually exclusive states. The second current enables the discharging of a storage capacitance of the lower output transistor thereby substantially disabling the lower output transistor before the upper output transistor is enabled. In addition, a voltage transition of the upper output transistor is capacitively coupled to the lower output transistor thereby momentarily discharging the storage capacitance as the upper output transistor is enabled. The capacitor is discharged when the upper output transistor is disabled.

BRIEF DESCRIPTION OF THE DRAWINGS

The sole FIGURE schematically illustrates a voltage translator circuit in accordance with the present invention.

DETAILED DESCRIPTION OF THE DRAWINGS

The sole FIGURE illustrates a voltage translator 10 that is suitable for translating emitter coupled logic (ECL) levels to transistor-transistor logic (TTL) levels or other compatible logic levels. Translator 10 includes a differential amplifier 11 having differential inputs 15 and 20 which connect a differential ECL input signal to a base of each differentially coupled transistor 21 and 22 respectively. A collector of each transistor 21 and 22 is coupled through series resistors 18 and 19 respectively to a power supply terminal 54. An emitter of each of transistors 21 and 22 is coupled to a power supply return 56 through a constant current source 23. The collectors of transistors 21 and 22 function as differential outputs which couple an amplified signal to a pair of differential mirror inputs of a current mirror 12. The amplified signal is coupled to the mirror inputs by a base of a transistor 24 which is connected to the collector of transistor 21 and by the collector of transistor 22 which is connected to a base of a transistor 26. Current mirror 12 produces a pair of currents, labeled $I_2$ and $I_3$, that are proportional to the amplified signals applied to transistors 24 and 26. Mirror 12 also includes a diode connected transistor 31 which has a base and a collector connected to a base of a transistor 32 to ensure substantially equal current flow, labeled $I_1$, through both transistors 31 and 32. An emitter of each transistor 31 and 32 is connected to return 56. Transistor 24 has a collector coupled to terminal 54, and an emitter connected to the collector of transistor 31 by a series resistor 27. Consequently, current $I_1$ plus the proportional current $I_2$ flows through transistor 24. Similarly, current $I_1$ plus proportional current $I_3$ flows through transistor 26 since a collector of transistor 26 is connected to terminal 54, and an emitter is connected to one terminal of a series resistor 28 a second terminal of which is connected to the collector of transistor 32.

A phase splitter transistor 36 controls a lower output transistor 57 and an upper output Darlington transistor 16. Current $I_3$ functions as a first current mirror output that controls transistor 36 through a connection between a base of transistor 36 and the collector of transistor 32. To facilitate the control of transistors 16 and 57, a collector of transistor 36 is connected to a base of a double emitter transistor 43 and also to one terminal of a resistor 37. A second terminal of resistor 37 is connected to terminal 54. Also, an emitter of transistor 36 is connected to a base of transistor 57. When transistor 36 is enabled by current $I_3$, transistor 16 is disabled and transistor 57 is enabled. Conversely, when transistor 36 is disabled, transistor 16 is enabled and transistor 57 is disabled.

Current $I_2$ functions as a second current mirror output that controls a discharge circuit 13. Enabling of circuit 13 reduces the turn-off time of transistor 57 by discharging the parasitic base storage capacitance of transistor 57. Circuit 13 includes a transistor 34 which has a base coupled to the collector of transistor 31 through a series resistor 33, and an emitter which is connected to return 56. A collector of transistor 34 is connected to the base of transistor 57. Transistor 34 is always enabled, and varies from an active to a saturated condition based on the value of current $I_2$. When $I_3$ is larger than $I_2$, transistor 34 is enabled but not saturated, and transistor 36 is enabled thereby saturating transistor 57 and disabling transistor 16. When $I_2$ becomes larger than $I_3$, transistor 36 becomes disabled thereby disabling transistor 57 and enabling transistor 16, and simultaneously transistor 34 becomes saturated thereby rapidly discharging the parasitic base storage capacitance of transistor 57. Saturating transistor 34 ensures rapid turn-off of transistor 57 thereby substantially preventing both transistors 16 and 57 from being simultaneously enabled. Consequently, "through" current is substantially eliminated. The value of resistor 33 is chosen to ensure that current $I_2$ saturates transistor 34 when input 20 is more positive than input 15. In the preferred embodiment, transistors 34, 36, and 57 are Schottky transistors to further decrease switching time.

While transistor 36 is disabled, a clamp circuit 64 clamps the voltage applied to the base of transistor 36 to a value that ensures transistor 36 remains disabled. In the preferred embodiment, the voltage is clamped at approximately 0.6 volts. Clamp circuit 64 includes a diode connected transistor 68 that has a base and a collector connected to a first terminal of a resistor 67, and an emitter that is connected to the base of transistor 36. Another diode connected transistor 66 has a base and a collector connected to terminal 54 and also to a second terminal of resistor 67. An emitter of transistor 66 is connected to the base of transistor 68, to a base of a transistor 69, and to a collector of transistor 69. A diode 71 has a cathode connected to return 56 and an anode connected to an emitter of transistor 69. In the preferred embodiment, diode 71 is a Schottky diode to provide a low voltage drop that ensures transistor 36 is disabled.

Translator 10 also has an output stage that includes upper output Darlington transistor 16 and lower output transistor 57. Transistor 16 includes a transistor 44 that is connected in a Darlington configuration with double emitter transistor 43. A first emitter 45 of transistor 43 is connected to a base of transistor 44. A second emitter 40 follows the voltage of first emitter 45 and permits transistor 43 to drive a large capacitive load without degrading the performance of transistor 16. A collector of transistor 43 is connected to a collector of transistor 44 to complete the Darlington connection, and also to a cathode of a diode 47. In the preferred embodiment, transistor 43 is a Schottky transistor to reduce the transistor's switching time. An anode of diode 47 is connected to terminal 54 through a series resistor 46 in order to supply a resistor limited output current to transistor 16. Translator 10 also has an output terminal 53 which is connected to an emitter of transistor 44 and to a collector of transistor 57. Another connection of the output stage is via an emitter of transistor 57 that is connected to return 56.

An a.c. coupled Miller killer circuit 14 also assists in discharging the base storage capacitance of transistor 57. Circuit 14 includes a transistor 58 having an emitter and a base connected to a base of a transistor 59 and to a cathode of a diode 61. A Miller input is formed by connecting a collector of transistor 58 to emitter 40 of transistor 43. Transistor 58 functions as a capacitor which a.c. couples emitter 40 to the base of transistor 59. The double emitter configuration of transistor 43 permits charging the capacitor, formed by transistor 58, without degrading the performance of transistor 44. An emitter of transistor 59 is connected to return 56 while a collector is connected to a cathode of a diode 62. An anode of each diode 61 and 62 is connected to the base of transistor 57 to form a Miller output. When transistor 43 is enabled, the capacitor is charged. When transistor 43 is disabled, the capacitor is discharged through a resistor 51 that has one terminal connected to the collector of transistor 58 and another terminal connected to an anode of a diode 52. The cathode of diode 52 is connected to terminal 53 to complete the discharge path. In the preferred embodiment, diodes 52, 61, and 62 are Schottky diodes to provide fast switching speed. Resistor 51 and diode 52 function as a restore circuit 50 that restores the capacitor to a discharged state. Without restore circuit 50 the capacitor would remain charged and would not function properly. As transistor 43 is once again enabled, emitter 40 is enabled which capacitively couples a positive transition to the base of transistor 59 and momentarily enables transistor 59. The enabling of transistor 59 momentarily couples the base of transistor 57 to return 56 which assists in discharging the parasitic base storage capacitance of transistor 57. Since circuit 14 is enabled after the enabling of transistor 16, circuit 13 is enabled before circuit 14 to ensure transistor 57 is disabled before transistor 16 is enabled.

A speed up circuit 17 includes a transistor 39 having an emitter connected to the collector of transistor 36. A base of transistor 39 is connected to one terminal of a resistor 38 the other terminal of which is connected to terminal 54. Transistor 39 assists in discharging the base storage capacitance of transistor 44 in addition to the output capacitance on output terminal 53 thereby providing a rapid high to low transition on output terminal 53. A collector of transistor 39 is connected to a cathode of a diode 42 and to a cathode of a diode 41. An anode each diode 41 and 42 is connected to terminal 53 and to the base of transistor 44 respectively. The base storage capacitance of transistor 44 is also discharged through a diode 49 and a resistor 48. A cathode of diode 49 is connected to terminal 53 and an anode of diode 49 is connected to one terminal of resistor 48 while another terminal of resistor 48 is connected to the base of transistor 44. In the preferred embodiment, transistor 39 and diodes 41, 42, and 49 are Schottky devices to further increase the switching speed of translator 10.

By now it should be appreciated that there has been provided a novel voltage translator. A discharge circuit is used to actively discharge the base storage capacitance of a lower output transistor thereby ensuring rapid turn off of the lower transistor and substantially eliminating "through" current between the lower transistor and an upper transistor. One emitter of a multiple emitter transistor is used to isolate the capacitance of an a.c. coupled Miller killer circuit thereby facilitating rapid switching between active and inactive states of the multiple emitter transistor. The rapid switching further assists in preventing "through" current. A restore circuit is used to discharge a capacitor of the Miller killer circuit while the multiple emitter transistor is disabled thereby staging the capacitor to once again be activated.

What is claimed is:

1. A voltage translator comprising:
   a differential amplifier having a pair of differential inputs and a pair of differential outputs that produce an amplified signal;
   a current mirror having a pair of mirror inputs coupled to the pair of differential outputs and also having a first current output and a second current output wherein the first current output and the second current output each produce a current that is proportional to a voltage applied to the differential inputs;
   a clamp circuit that clamps the first current output to a predetermined voltage when the first current output has a current value that is less than a current value of the second current output;
   a phase splitter transistor having a control electrode coupled to the first current output, a first current electrode coupled to a first terminal of a first resistor, and a second current electrode;
   a second terminal of the first resistor connected to a voltage supply terminal;
   a first transistor having a control electrode coupled to a first terminal of a second resistor, a first current electrode coupled to the second current electrode of the phase splitter transistor, and a second current electrode coupled to a voltage return;

a second terminal of the second resistor coupled to the second current output;

a lower output transistor having a control electrode coupled to the first current electrode of the first transistor, a first current electrode coupled to the voltage return, and a second current electrode;

an a.c. coupled Miller killer circuit having a Miller output coupled to the control electrode of the lower output transistor, and a Miller input that is capacitively coupled to the Miller output;

an upper Darlington transistor including a second transistor and a third transistor, wherein the second transistor has a control electrode coupled to the first current electrode of the phase splitter transistor, a first current electrode coupled to a first current electrode of the third transistor, a second current electrode coupled to a control electrode of the third transistor, and a third current electrode coupled to the Miller input;

an output terminal of the voltage translator coupled to a second current electrode of the third transistor and to the second current electrode of the lower output transistor;

a third resistor having a first terminal coupled to the Miller input, and a second terminal; and a first diode having an anode coupled to the second terminal of the third resistor, and a cathode coupled to the output terminal.

2. The voltage translator of claim 1 further including a fourth resistor having a first terminal coupled to the supply voltage terminal and a second terminal coupled to an anode of a second diode, the second diode having a cathode coupled to the first current electrode of the third transistor.

3. The voltage translator of claim 1 further including a fourth resistor having a first terminal coupled to the control electrode of the third transistor, and a second terminal coupled to an anode of a second diode, the second diode having a cathode coupled to the output terminal.

4. The voltage translator of claim 1 wherein the differential amplifier comprises: a fourth transistor having a control electrode coupled to a first input of the pair of differential inputs, a first current electrode coupled to a first terminal of a constant current source, and a second current electrode coupled to a first terminal of fourth resistor; a fifth transistor having a control electrode coupled to a second input of the pair of differential inputs, a first current electrode coupled to the first terminal of the constant current source, and a second current electrode coupled to a first terminal of a fifth resistor; a second terminal of the fourth resistor coupled to the power supply terminal and to a second terminal of the fifth resistor; and a second terminal of the constant current source coupled to the power supply return.

5. The voltage translator of claim 1 wherein the current mirror comprises: a fourth transistor having a control electrode coupled to a first mirror input of the pair of mirror inputs, a first current electrode coupled to the power supply terminal, and a second current electrode coupled to a first terminal of a fourth resistor; a fifth transistor having a control electrode coupled to a second input of the pair of mirror inputs, a first current electrode coupled to the power supply terminal, and a second current electrode coupled to a first terminal of a fifth resistor; a sixth transistor having a control electrode and a first current electrode coupled to a second terminal of the fourth resistor and to the second current output, and a second current electrode coupled to the power supply return; and a seventh transistor having a control electrode coupled to the control electrode of the sixth transistor, a first current electrode coupled to a second terminal of the fifth resistor, and a second current electrode coupled to the power supply return.

6. The voltage translator of claim 1 wherein the clamp circuit comprises: a fourth transistor having a first current electrode coupled to the first current output, a control electrode and a second current electrode coupled a first terminal of a fourth resistor; a fifth transistor having a control electrode and a first current electrode coupled to the first terminal of the fourth resistor, and a second current electrode; a seventh transistor having a control electrode and a first current electrode coupled to the power supply terminal and to a second terminal of the fourth resistor, and a second current electrode coupled to the first terminal of the fourth resistor; and a second diode having an anode coupled to the second current electrode of the fifth transistor, and a cathode coupled to the power supply return.

7. The voltage translator of claim 1 wherein the a.c. coupled Miller killer circuit comprises: a fourth transistor having a first current electrode coupled to the Miller input, a control electrode and a second current electrode coupled to a control electrode of a fifth transistor and to a cathode of a second diode; the fifth transistor having a first current electrode coupled to the power supply return, and a second current electrode coupled to a cathode of a third diode; and an anode of the third diode coupled to an anode of the second diode and to the Miller output.

8. The voltage translator of claim 1 further including a speed-up circuit comprising: a fourth transistor having a first current electrode coupled to the first current electrode of the phase splitter transistor, a control electrode coupled to a first terminal of a fourth resistor, and a second current electrode coupled to a cathode of a second diode and to a cathode of a third diode; a second terminal of the fourth resistor coupled to the power supply terminal; an anode of the second diode coupled to the output terminal; and an anode of the third diode coupled to the control electrode of the third transistor.

9. A voltage translator comprising:
a first current output and a second current output that each produce a current that is proportional to a signal applied to a pair of differential inputs;
a first transistor having a control electrode coupled to the first current output, a first current electrode, and a second current electrode;
a second transistor having a control electrode coupled to a first terminal of a first resistor, a first current electrode coupled to the first current electrode of the first transistor, and a second current electrode coupled to a power supply return;
a second terminal of the first resistor coupled to the second current output;
a lower output transistor having a control electrode coupled to the first current electrode of the first transistor, a first current electrode coupled to the power supply return, and a second current electrode;
an upper output transistor including a third transistor and a fourth transistor wherein the third transistor has a control electrode coupled to the second current electrode of the first transistor, a first current electrode coupled to a first current electrode of the fourth transistor, a second current electrode coupled to a control electrode of the fourth transistor, and a third current electrode coupled to a capacitor; and an output terminal of the voltage translator coupled to a second current electrode of the fourth transistor and to a second current electrode of the lower output transistor.

10. The voltage translator of claim 9 further including a differential amplifier having the pair of differential inputs and a pair of differential outputs coupled to a current mirror that produces the current that is proportional to the signal applied to the pair of differential inputs.

11. The voltage translator of claim 9 further including a second resistor having a first terminal coupled to the third current electrode of the third transistor, and a second terminal coupled to an anode of a first diode wherein the first diode has a cathode coupled to the output terminal.

12. The voltage translator of claim 9 wherein the capacitor comprises: a fifth transistor having a first current electrode coupled to the third current electrode of the third transistor, and a control electrode and a second current electrode coupled to a control electrode of a sixth transistor; the sixth transistor having a first current electrode coupled to the power supply return, and a second current electrode; a first diode having a cathode coupled to the control electrode of the fifth transistor, and an anode coupled to the control electrode of the lower output transistor; and a second diode having a cathode coupled to the second current electrode of the sixth transistor, and an anode coupled to the control electrode of the lower output transistor.

13. The voltage translator of claim 12 further including a seventh transistor having a first current electrode coupled to the second current electrode of the first transistor, a control electrode coupled to the power supply terminal, and a second current electrode coupled to an anode of a third diode and to an anode of a fourth diode wherein the third diode has a cathode coupled to the control electrode of the fourth transistor, and wherein the fourth diode has a cathode coupled to the output terminal.

14. A method of translating an ECL signal to a TTL signal comprising:

converting a differential ECL signal to a first current and a second current that are proportional to the ECL signal;

selectively switching an upper output transistor and a lower output transistor between a disabled state and an enabled state wherein the switching is controlled by the first current;

discharging a storage capacitance of the lower output transistor during the enabled state of the upper output transistor wherein the discharging is enabled by the second current;

capacitively coupling a voltage change on a current electrode of the upper transistor to the lower output transistor for momentarily discharging the storage capacitance of the lower output transistor, the current electrode coupled to a capacitor wherein the capacitor does not degrade switching speed of the upper output transistor; and discharging the capacitor when the upper output transistor is disabled.

15. The method of claim 14 wherein discharging the capacitor includes discharging the capacitor to an output terminal of the translator.

16. The method of claim 15 wherein discharging the capacitor to the output terminal of the translator includes discharging the capacitor through a diode and a resistor wherein the resistor has a first terminal coupled to the current electrode of the upper output transistor, and a second terminal coupled to an anode of a diode wherein the diode has a cathode coupled to the output terminal of the translator.

17. The method of claim 14 wherein selectively switching the upper output transistor and the lower output transistor between the disabled state and the enabled state includes selectively switching a phase splitter transistor between a disabled state and an enabled state, the phase splitter transistor having a first current electrode couple to a control electrode of the upper output transistor, a second current electrode coupled to a control electrode of the lower output transistor, and a control electrode that is coupled to the first current.

18. The method of claim 14 wherein discharging the storage capacitance of the lower output transistor during the enabled state of the upper output transistor includes using the second current to saturate a first transistor wherein the the first transistor substantially discharges the storage capacitance of the lower output transistor.

* * * * *